United States Patent [19]

Bradley

[11] Patent Number: 5,123,070
[45] Date of Patent: Jun. 16, 1992

[54] METHOD OF MONOLITHIC TEMPERATURE-STABILIZATION OF A LASER DIODE BY EVANESCENT COUPLING TO A TEMPERATURE STABLE GRATING

[75] Inventor: Eric M. Bradley, San Diego, Calif.

[73] Assignee: Tacan Corporation, Carlsbad, Calif.

[21] Appl. No.: 579,594

[22] Filed: Sep. 10, 1990

[51] Int. Cl.$^5$ ............................ G02B 6/34; H01S 3/13
[52] U.S. Cl. ........................................ 385/37; 385/42; 385/131; 385/30; 372/32
[58] Field of Search ............... 350/96.11, 96.12, 96.13, 350/96.14, 96.15, 96.17, 96.19, 96.20; 372/6, 32; 385/37, 41, 42, 49, 88, 10, 130, 131, 132, 30

[56] References Cited

U.S. PATENT DOCUMENTS

| | | | |
|---|---|---|---|
| 4,639,922 | 1/1987 | Miller | 372/19 |
| 4,815,081 | 3/1989 | Mahlein et al. | 372/32 |
| 4,852,960 | 8/1989 | Alferness et al. | 350/96.19 |
| 4,860,294 | 8/1989 | Winzer et al. | 350/96.12 X |
| 4,952,019 | 8/1990 | Evans et al. | 350/96.19 |
| 4,993,032 | 2/1991 | Bradley | 372/32 |
| 5,022,042 | 6/1991 | Bradley | 372/32 X |
| 5,042,898 | 8/1991 | Morey et al. | 385/37 |
| 5,043,991 | 8/1991 | Bradley | 372/32 |

OTHER PUBLICATIONS

"Monolithically-Integrated Hybrid Heterostructure Diode Laser with Dielectric-Film Waveguide DBR", Zh. I. Alferov et al., *IEEE J. of Quant. Elec.*, vol. QE-23, No. 6, Jun. 1987, pp. 869-881.

"Testing of a Bragg Heterojunction Injection Laser with a Thermally Stable Output Wavelength", S. A. Gurevich, *Sov. Tech. Phys. Lett.*, 11(5), May 1985, pp. 218-220.

"Single Wavelength Operation of the Hybrid External Bragg Reflector Waveguide Laser Under Dynamic Conditions", J. M. Hammer et al., *Appl. Phys. Lett.*, 47(3), Aug. 1, 1985, pp. 183, 185.

"Passive Components for Optical Coupling and WDM Applications", G-D Khoe, Chap. 7 of *Electronic Technology and Lightwave Communications Systems*, Edited by C. Lin, Van Nostrand Reinhold, N.Y., 1989, pp. 175-194.

Primary Examiner—Brian Healy
Attorney, Agent, or Firm—Brown, Martin, Haller & McClain

[57] ABSTRACT

An integral waveguide is formed in the epitaxial layers as a continuation of a diode laser. The waveguide runs away from the laser active region. Light is coupled out of the laser and its integral waveguide into a dielectric waveguide which runs parallel and adjacent to the integral waveguide. Processing to form the temperature-stabilized Bragg grating, therefore, need not be performed on the laser substrate directly adjacent to the active area, but can be done some distance away to avoid damage to the laser's active area.

9 Claims, 1 Drawing Sheet

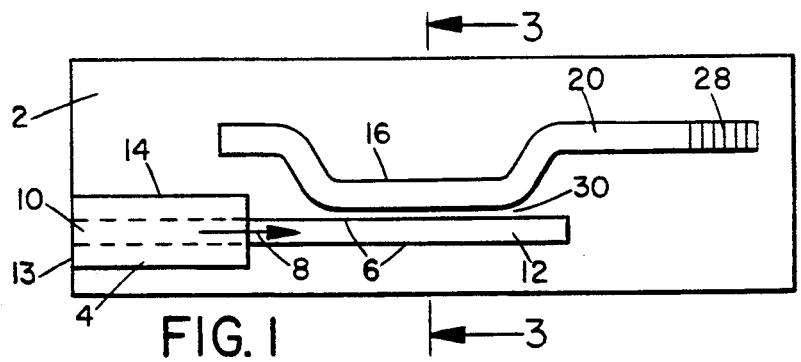
FIG. 1
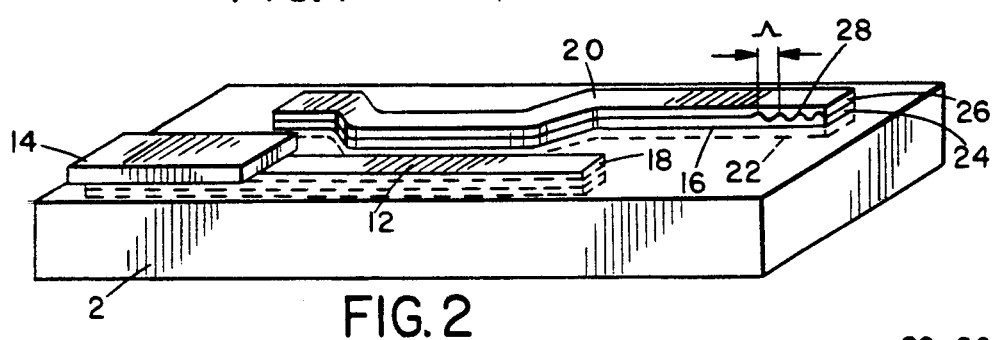
FIG. 2
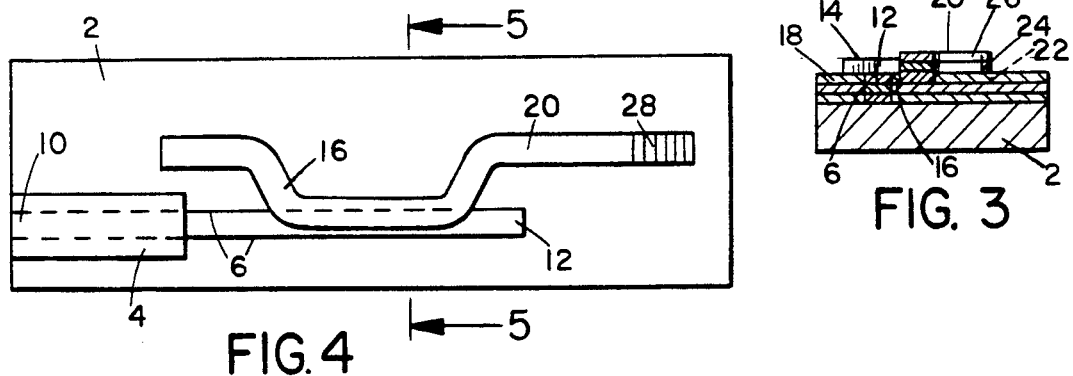
FIG. 3
FIG. 4
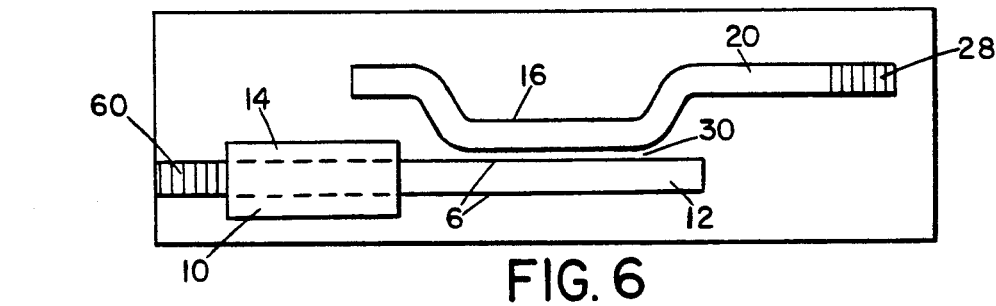
FIG. 6
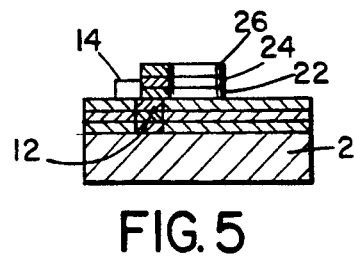
FIG. 5

METHOD OF MONOLITHIC TEMPERATURE-STABILIZATION OF A LASER DIODE BY EVANESCENT COUPLING TO A TEMPERATURE STABLE GRATING

BACKGROUND OF THE INVENTION

I. Field of the Invention

The present invention relates to semiconductor diode lasers and more specifically to temperature-stabilized diode lasers.

II. Background Art

In order to handle the increasing demands for high data rate communications, fiber-optic databus systems require the ability to multiplex wavelengths. The practical range within which wavelengths can be multiplexed is limited by the luminescence spectrum of semiconductor diode lasers, which has a useful band of only 200-300 Å. It is not practical to fabricate a large number of lasers with different compositions to broaden this range to 2,000 to 10,000 Å so as to allow large numbers of channels without temperature-stabilized wavelengths. Therefore, in order to propagate the greatest number of signals within this narrow spectrum, the wavelengths must be very stable and tightly controlled.

The best wavelength stabilized diode lasers available today are the distributed feedback laser (DFB) and distributed Bragg reflector laser (DBR). In these lasers, rather than using end mirrors, light is reflected from corrugated waveguides (Bragg gratings) back into the laser active area.

Early DFB and DBR lasers used waveguides which were formed from the same material as the active region. Since the material of the active region was chosen to optimize gain properties, not grating properties, some of the grating characteristics were compromised, including temperature stability (due to changes in refractive index with temperature).

The range of operating temperatures over which diode lasers are normally operated is about 20° C. to 70° C. The variation in wavelength is about 5 Å/°C. for laser diodes with conventional cavities, and about 1 Å/°C. for DFB or DBR lasers. Therefore the wavelength will drift about 50 Å over the required temperature range for even the best stabilized lasers.

Thermally-stabilized DBR lasers were described by S. A. Gurevich, et al., Sov. Tech. Phys. Lett. 11(5), May, 1985 and by Zh.I. Alferov, et al., IEEE Journal of Quantum Electronics, Vol. QE-23, No. 6, June, 1987. The lasers described incorporated a corrugated waveguide consisting of multiple dielectric layers, each layer with approximately equal and opposite changes in refractive index of temperature. The effect intended is that there is no net change in refractive index with temperature due to the offset of one layer by another, thus, no resulting change in wavelength occurs.

The monolithic temperature-stabilized lasers of Gurevich, et al. and Alferov, et al. suffer the disadvantage, however, that the processing required to form the waveguide on a single substrate degrades the reliability of the laser facets. After formation of the active layer, the waveguide is formed by selective chemical etching and "micro-cleaving" of the layers, followed by deposition of the dielectric layers. Exposure of the active area to chemical etching compromises the laser's reliability due to cusping or undercut of the laser active area. It is also probable that the long-term reliability of the facets formed by "micro-cleaving" process is not as good as those formed by conventional cleaving. Further, dielectric layers deposited adjacent to the cleaved facet tend to show "edge effects" in that the edges of the dielectric are thicker, forming an edge bead and interfering with coupling between the laser and the waveguide. These lasers are capable of maintaining a stable wavelength within the 5 Å band, which is still severely limiting for wavelength multiplexing when the useful laser band is only 200-300 Å. In addition, because of different coefficients of expansion for the semiconductor substrate and the deposited dielectric, there is a risk of the dielectric pealing off the substrate. Such problems are particularly likely to occur at the interface between the micro-cleaved laser facet and the dielectric film.

In a co-pending application (Ser. No. 07/458,155), now U.S. Pat. No. 5,043,991 the inventor discloses a method of stabilizing temperature-induced emission wavelength fluctuation in semiconductor diode lasers by assembling the laser together with a temperature-stabilized Bragg waveguide. The purpose of that procedure is to eliminate temperature-induced variations in wavelength, enabling tight control over wavelengths within 1 Å, as necessary for advanced optical communications systems.

The procedure of assembling a hybrid temperature-stabilized Bragg reflector waveguide with a diode laser has many advantages over the prior art monolithically-integrated hybrid diode laser with waveguide, namely independent optimization of materials of each of the two components (laser and Bragg reflector) for their specific purpose and elimination of Bragg grating process steps which degrade the laser active area. However, the stability of the external Bragg reflector is affected by mechanical alignment between the laser and Bragg reflector chip. The thickness of the active layer of the laser is typically about 0.1 micron for a conventional diode laser. This means that the waveguide of the separate chip must be aligned to the active layer to tolerances comparable to the active layer thickness. Even small shifts of less than 0.1 micron in the alignment of the waveguide chip with respect to the laser will result in a change in the operating point. For larger offsets, the coupling will be reduced and single-frequency operation may not be achieved or may be intermittent. In addition, in the case of the temperature-stabilized laser, the light launched into the waveguide must also be coupled back into the laser. This forces a waveguide to be approximately 0.1 micron thick, as well, to maintain efficient coupling in both directions.

An experimental solution to the alignment difficulty of external waveguides is to place the laser and waveguide on separate precision mechanical stages. This, however, is impractical for commercial application where trial-and-error adjustment is contrary to the concept of the off-the-shelf flexibility. See, e.g., J. M. Hammer, et al., *Single-Wavelength Operation of the Hybrid-External Bragg-Reflector-Waveguide Laser Under Dynamic Conditions*, Appl. Phys. Lett. 47(3) Aug. 1, 1985.

It would be desirable to establish a technique for monolithically providing a temperature-stabilized waveguide which provides the same effect as an external Bragg grating without the alignment difficulties involved with coupling an external waveguide to the laser which is to be stabilized and which does not detract from the lifetime of the laser. It is toward this object that the present invention is directed.

SUMMARY OF THE INVENTION

It is an advantage of the present invention to provide an improved technique for temperature stabilization of the emission wavelength of diode lasers using monolithically-integrated Bragg waveguides. In an exemplary embodiment, a waveguide is formed in the substrate as a continuation of a diode laser. The waveguide runs away from the laser active region. Light is coupled out of the laser and its integral waveguide into a dielectric waveguide which runs parallel and adjacent to the integral waveguide. The dielectric waveguide comprises a plurality of layers of dielectric with compensating index-temperature coefficients. A bragg grating is formed in the dielectric waveguide for controlling the laser's emission wavelength according to the grating spacing. Processing to form the temperature-stabilized Bragg grating, therefore, need not be performed on the laser substrate directly adjacent to the active area, but can be done some distance away to avoid damage to the laser's active area.

The advantage provided is that the additional processing needed to form the Bragg grating is performed remotely from the laser active area, avoiding exposure of the sensitive active region to subsequent processing, thereby extending the lifetime of the laser as compared to monolithic temperature stabilized lasers of the prior art.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which:

FIG. 1 is a diagrammatic top view of a first embodiment of the present invention;

FIG. 2 is a perspective view of the first embodiment;

FIG. 3 is a cross-sectional view taken along line 3—3 of FIG. 1;

FIG. 4 is a diagrammatic top view of a second embodiment of the present invention;

FIG. 5 is a cross-sectional view taken along line 5—5 of FIG. 4; and

FIG. 6 is a diagrammatic top view of a third embodiment of the present invention.

DETAILED DESCRIPTION OF THE PREFERRED EMBODIMENTS

In the first embodiment shown in FIGS. 1 through 3, a diode laser is formed on a semiconductor substrate 2 by epitaxial growth of n- and p-doped layers as is known in the art. To confine the optical field and carrier recombination to a small active volume, lateral sides 6 are defined in the substrate parallel to the intended light path 8. The lateral sides 6 are formed by etching before or after epitaxial growth to permit a break in refractive index and electrical properties to confine the active region. By creating these lateral sides 6 to extend a length much longer than is actually needed for the gain region 10, a waveguide 12 is formed which is integral with the laser. The later step of forming a single-cleaved facet 13 and contacts 14 defines the actual length of the laser gain region 10, the remainder of the portion defined by lateral sides 6 being waveguide 12. If continuous arrays of lasers are formed on the same substrate there need not be any cleaved facets. This is a significant advantage since facets are the most unreliable part of a diode laser.

A groove or ridge 16 is formed by localized etching into the upper epitaxial layer corresponding to an upper cladding layer 18. The groove or ridge 16 is located so that at least a portion of its length runs parallel to waveguide 12 sufficiently close to allow energy transfer by evanescent coupling between waveguide 12 and a dielectric waveguide 20 which corresponds to groove or ridge 16.

Dielectric waveguide 20 is formed by sequential deposition of dielectric layers over the surface of the epitaxial layers. The first dielectric layer 22 is $SiO_2$, which has a change in refractive index with temperature (hereafter called "index-temperature coefficient") of approximately $1.0 \times 10^{-5}/°C$.

The second dielectric layer 24 has an index-temperature coefficient which is approximately equal in magnitude but opposite to the index-temperature coefficient of $SiO_2$. The suggested material for the second dielectric layer 24 is $Ta_2O_5$, however, other materials possessing the same index-temperature coefficient of approximately $-1.2$ to $-1.4 \times 10^{-5}/°C$. are acceptable and fall within the scope of the invention.

At the end of waveguide 20 which is most distant from the gain region 10 a Bragg grating 28 is formed in a second dielectric layer. The period or spacing $\Lambda$ of the corrugations of the Bragg grating 28 is determined according the equation $\lambda_{peak} = 2\Lambda n_{eff}$ where $\lambda_{peak}$ is the desired wavelength for lasing and $n_{eff}$ is the refractive index of the second dielectric layer 24.

A third dielectric layer 26, consisting of $SiO_2$, is deposited over second dielectric layer 24 to provide the upper cladding of the waveguide 20.

Processing is completed by opening windows in the dielectric layers over the gain region 10 through which contact may be made for supplying current to the laser.

During operation, excitation will occur in the gain region 10 with the light produced being guided out of the laser through waveguide 12. The portion of waveguide 20 which comes close to and runs parallel to waveguide 12 receives light from waveguide 12 by optical tunneling through the thin barrier 30 between the two waveguides. The coupled light is then guided through waveguide 20 toward Bragg grating 28 which reflects light of the desired wavelength selected by constructive interference back into waveguide 20. The reflected light is coupled back into waveguide 12 through barrier 30 and into laser 4 to cause the laser to emit at the desired wavelength.

In the second embodiment shown in FIGS. 4 and 5, formation of the laser 4 and waveguide 12 are completed as above. Rather than etching into the upper cladding layer 18 of waveguide 12, the dielectric waveguide 20 is deposited and patterned so that a portion of it directly overlies waveguide 12. Light is coupled up through cladding layer 18 into dielectric layers 24, 26 and 28 and is guided toward Bragg grating 28. The selectively reflected light is guided back down waveguide 20 and coupled into waveguide 12 which guides the light back into laser 4.

In a third embodiment, shown in FIG. 6, replacement of cleaved facets with a second order grating 60 formed monolithically with the laser makes possible the fabrication of grating coupled surface emitting lasers (GCSELs) using the same coupling techniques as described in the first and second embodiments. The GCSELs thus formed are similarly temperature stabilized against wavelength variations by the Bragg grating in the dielectric waveguide. Note that second order gratings can also be formed in the dielectric waveguide to obtain surface emission. The refractive indices of the dielectrics considered here are about one-half those of the semiconductor materials. This results in grating spacings which are about twice as large as in semiconductor gratings. This makes the gratings considerably easier to fabricate and is a significant advantage of GCSELs with dielectric gratings over GCSELs with semiconductor gratings.

The method of coupling diode lasers to temperature-stabilized lasers according to the present invention permits monolithic integration of the Bragg grating without degrading the laser active area by exposure to subsequent processing. The active area is well protected during the photolithographic and etching processes used to define the dielectric waveguide and Bragg grating and therefore the laser retains the lifetime of which it is capable as manufactured before subsequent processing to form the gratings.

It will be evident that there are additional embodiments which are not illustrated above but which are clearly within the scope and spirit of the present invention. The above description and drawings are therefore intended to be exemplary only and the scope of the invention is to be limited solely by the appended claims.

I claim:

1. A method for monolithically coupling a diode laser to a wavelength stabilizer which comprises:
   selecting a substrate;
   forming a diode laser on said substrate with an optical path running therethrough;
   forming a first waveguide integral with said diode laser and extending for a length therefrom along said optical path;
   defining a location on said substrate separate from said diode laser, adjacent to and running parallel to at least a portion of said first waveguide;
   depositing a plurality of dielectric layers having approximately equal and opposite index-temperature coefficients over said location whereby a second waveguide is formed; and
   forming a Bragg grating on a portion of said second waveguide corresponding to said location farthest from said diode laser so that light emitted by said diode laser is guided by said first waveguide, coupled into said second waveguide and subjected to wavelength stabilization by said Bragg grating.

2. A method as in claim 1 wherein the step of defining a location includes defining said location in close enough proximity to said first waveguide to permit coupling of light from said first waveguide to said second waveguide for at least a portion of their respective lengths.

3. A method as in claim 1 wherein the step of forming a Bragg grating further comprises forming a Bragg grating between adjacent waveguide layers.

4. A method as in claim 1 wherein said diode laser has an end facet along said optical path opposite said first waveguide.

5. A method as in claim 1 wherein said diode laser has a secondary grating along said optical path opposite said first waveguide whereby a surface emitting laser is formed.

6. A method of monolithically coupling a diode laser to a wavelength stabilizer which comprises:
   selecting a substrate;
   forming a diode laser on said substrate with an optical path running therethrough;
   forming a first waveguide integral with said diode laser and extending for a length therefrom along said optical path;
   depositing a plurality of dielectric layers having approximately equal and opposite index-temperature coefficients over said diode laser and said first waveguide;
   defining a second waveguide in said plurality of dielectric layers so that a first portion of said second waveguide overlies said first waveguide and at least one second portion of said second waveguide is separated from said first waveguide and said diode laser; and
   forming a Bragg grating on said second portion of said second waveguide at a location farthest from said diode laser so that light emitted by said diode laser is guided by said first waveguide, coupled into said second waveguide and subjected to wavelength stabilization by said Bragg grating.

7. A method as in claim 6 wherein the step of forming a Bragg grating further comprises forming a Bragg grating between adjacent dielectric layers.

8. A method as in claim 6 wherein said diode laser has an end facet along said optical path opposite said first waveguide.

9. A method as in claim 6 wherein said diode laser has a secondary grating along said optical path opposite said first waveguide whereby a surface emitting laser is formed.

* * * * *